(12) United States Patent
Okuaki

(10) Patent No.: US 6,346,723 B2
(45) Date of Patent: *Feb. 12, 2002

(54) SEMICONDUCTOR MEMORY DEVICE HAVING MEMORY CELL AREA AND PERIPHERAL CIRCUIT AREA

(75) Inventor: Katsumi Okuaki, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/185,637

(22) Filed: Nov. 4, 1998

(30) Foreign Application Priority Data

Nov. 5, 1997 (JP) .............................. 9-302938

(51) Int. Cl.[7] ...................... H01L 27/108; H01L 29/94
(52) U.S. Cl. .................. 257/296; 257/306; 257/758
(58) Field of Search ................. 257/296, 297, 257/298, 306, 758; 438/239, 241, 253

(56) References Cited

U.S. PATENT DOCUMENTS 5,066,997 A  * 11/1991 Sakurai et al. ................ 357/45
5,289,422 A  *  2/1994 Mametani .................... 365/210
5,361,234 A  * 11/1994 Iwasa .......................... 365/210
5,441,915 A  *  8/1995 Lee .............................. 437/195

FOREIGN PATENT DOCUMENTS

| JP | 4-82263 | 3/1992 |
| JP | 4-87366 | 3/1992 |
| JP | H08-181290 | 7/1996 |
| JP | H05-275649 | 10/1996 |
| JP | H09-102592 | 4/1997 |
| JP | H09-246492 | 9/1997 |
| JP | H10-209401 | 8/1998 |
| JP | 10209401 A | * 8/1998 | .................. 27/108 |

* cited by examiner

*Primary Examiner*—Steven Loke
*Assistant Examiner*—Douglas W. Owens
(74) *Attorney, Agent, or Firm*—Sughrue Mion, PLLC

(57) ABSTRACT

A first wiring layer is formed in a memory cell area on a semiconductor substrate. A first inter-layer insulating film for covering the first wiring layer is formed on the semiconductor substrate. A second wiring layer is formed in the memory cell area on the first inter-layer insulating film. A second inter-layer insulating film for covering the second wiring layer is formed on the first inter-layer insulating film. A signal wiring connected to at least of circuits in a peripheral circuit area is formed in a boundary area on the second inter-layer insulating film. A dummy wiring is formed of the same layer as the first wiring layer or the second wiring layer below the signal wiring.

13 Claims, 3 Drawing Sheets

SEMICONDUCTOR MEMORY DEVICE HAVING MEMORY CELL AREA AND PERIPHERAL CIRCUIT AREA

BACKGROUND OF THE INVENTION

1. Field of the Invention

The present invention relates to a semiconductor memory device having a memory cell area and a peripheral circuit area, and relates, more particularly, to a semiconductor memory device in which a difference in level between the memory cell area and the peripheral circuit area is reduced.

2. Description of the Related Art

There has recently been an increasingly diversified demand for a larger capacity, a higher processing speed, etc. of a very large-scale integrated circuit (VLSI) from the market. Particularly, this trend is acutely observed in a semiconductor memory device called a dynamic random access memory (DRAM) having memory cells.

While the number of memory cells in one semiconductor memory device is increasing along with an increase in capacity in one hand, an increase in the area of an integrated circuit has also been restricted on the other hand with a reduced size of unit area per one memory cell based on the development of fining technologies at various manufacturing stages.

When the unit area per one memory cell is reduced, in order to amplify a signal for showing a state (cell "HIGH") that a charge has been stored in a memory cell as the cell "HIGH" without a malfunction, it becomes necessary to secure a charge level (cell capacity) to be stored in each memory cell at a predetermined level or above.

For this purpose, a stacked-type memory cell is used, for example. In a stacked-type memory cell, an electrode for storing a charge for constituting a capacitor in which a charge is stored is formed at a position higher than a semiconductor substrate. This capacitor is structured by the electrode for storing a charge, a thin separating insulating film formed on the electrode, and a cell plate formed on the insulating film.

Accordingly, in a semiconductor device formed with an electrode for storing a charge, there exists a large difference in level between a peripheral circuit area, other than a memory cell area, in which the electrode for storing a charge is not formed and an area in which memory cells are formed. In other words, a large difference in height exists.

A signal wiring layer for selecting a sense amplifier circuit connected to a bit line is positioned, for example, as a higher layer than a layer in which a capacitor is formed and is formed by an aluminum wiring layer made of aluminum or the like. This sense amplifier circuit is formed in a peripheral circuit area of a semiconductor memory device. Accordingly, the signal wiring layer is formed in a boundary area formed with a sharp difference in level from the peripheral circuit area to the memory cell area.

Accordingly, the following problems occur in a process of forming a metal wiring layer such as an aluminum wiring layer that is a layer after the process of forming the capacitor.

In the process of forming a wiring layer, after a conductive film that is to be the wiring layer is formed, a wiring layer-shaped photoresist pattern is formed on this film by a photolithography technique. However, if there is a sharp difference in level as described above, there arises a large difference in focal points between the memory cell area and the peripheral circuit area at the time of exposing a photoresist to a light for forming the photoresist pattern. Therefore, a margin of a depth of focus for a light exposure is narrowed substantially.

As a result, in the worst case, there occurs the following situation after an exposure and development that the photoresist disappears from within an area that should remain as an area in which an aluminum wiring layer is to be formed. On the other hand, it occurs the photoresist remains in an area that should be removed by the development as an area in which the aluminum wiring layer is not to be formed. If the conductive film is etched in this state in an attempt to form a wiring layer, disconnection and short-circuiting of the wiring may occur. Such an inconvenience in the process of forming a wiring layer or the like finally results in a manufacturing of a fatal defective product as a semiconductor memory device.

To avoid the above problem, there has been provided a semiconductor memory device in which dummy memory cells that are not charged with or do not discharge any electric charge are disposed in a ring shape around an outermost peripheral portion of the memory cell area. These dummy memory cells are disposed adjacent to real memory cells to which electric charges are charged and which discharge the electric charges as actual memory cells in the memory cell area.

When the dummy memory cells are disposed in this way, the sharp difference in level between the memory cell area and the peripheral circuit area other than the memory cell area is suppressed. Accordingly, this restricts an occurrence of a defective photoresist pattern attributable to this level difference in the process of exposing and developing the photoresist and an occurrence of defective products due to the pattern failure.

There is disclosed a method for reducing a level difference by forming a dummy layer in Japanese Patent Application Laid-open Publication No. Hei 4-82263. FIG. 1 is a cross-sectional view for showing a semiconductor memory device described in Japanese Patent Application Laid-open Publication No. Hei 4-82263.

According to the semiconductor memory device described in Japanese Patent Application Laid-open Publication No. Hei 4-82263, a dummy layer 314 formed on an inter-layer insulating film 313 is provided on only a peripheral circuit area 312 other than a memory cell area 311. Then, a silicon oxide film 316 is formed on the whole top surfaces to make a flat surface. Further, a metal wiring layer 317 such as an aluminum wiring layer or the like is formed on the silicon oxide film 316.

Further, in Japanese Patent Application Laid-open Publication No. Hei 4-87366, there is disclosed a method for reducing a level difference by providing an element separating area having shielding electrodes and dummy level-difference parts in a boundary area between a memory cell area and a peripheral circuit area. FIG. 2 is a cross-sectional view for showing a semiconductor memory device described in Japanese Patent Application Laid-open Publication No. Hei 4-87366.

According to the semiconductor memory device described in Japanese Patent Application Laid-open Publication No. Hei 4-87366, there is provided an element separating area 403 between a memory cell area 401 and a peripheral circuit area 402. This element separating area 403 is provided with shielding electrodes 406a and 406b, and dummy level-difference parts 410a and 410b formed on the shielding electrodes 406a and 406b respectively.

These conventional semiconductor memory devices, however, have the following problems.

According to the conventional semiconductor memory device provided with dummy memory cells, there is a risk of an increase in the area of the integrated circuit as the dummy memory cells are formed in a ring shape around the outermost peripheral portion of the memory cell area. The area formed with the dummy memory cells is entirely a redundant area.

Further, the sharp difference in level between the dummy memory cells and the peripheral circuit area has not almost been reduced. Accordingly, it is not possible to completely prevent an occurrence of a defective photoresist pattern attributable to this sharp level difference between the memory cell area and the peripheral circuit area in the process of exposing and developing the photoresist and an occurrence of defective products due to the pattern failure.

According to the conventional semiconductor memory device described in Japanese Patent Application Laid-open Publication No. Hei 4-82263, it is necessary to form the dummy layer 314 on the peripheral circuit area 312 other than the memory cell area 311 before the process of forming the metal wiring layer 317 such as an aluminum wiring layer or the like. Therefore, it is necessary to add this new process. This results in an increase in the number of processes.

According to the conventional semiconductor memory device described in Japanese Patent Application Laid-open Publication No. Hei 4-87366, the element separating area 403 having the shielding electrodes 406*a* and 406*b* and the dummy level-difference parts 410*a* and 410*b* is formed between the memory cell area 401 and the peripheral circuit area 402. Therefore, this increases the area of the integrated circuit. Further, similar to the semiconductor memory device provided with the dummy memory cells, the element separating area 403 having the shielding electrodes 406*a* and 406*b* and the dummy level-difference parts 410*a* and 410*b* is an entirely redundant area.

SUMMARY OF THE INVENTION

It is an object of the present invention to provide a semiconductor memory device having a memory cell area and a peripheral circuit area that can be manufactured without an additional new manufacturing process, that enables the device to be further highly integrated and that can reduce an occurrence of line disconnection and short-circuiting and the like.

A semiconductor memory device having a memory cell area and a peripheral circuit area according to the present invention, comprises a semiconductor substrate divided into a memory cell area provided with a plurality of memory cells, a peripheral circuit area provided with a plurality of circuits for controlling the operation of the memory cells, which peripheral circuit area is provided around the memory cell area, and a boundary area provided between the memory cell area and the peripheral circuit area. A first wiring layer is formed in the memory cell area on the semiconductor substrate. A first inter-layer insulating film for covering the first wiring layer is formed on the semiconductor substrate. A second wiring layer is formed in the memory cell area on the first inter-layer insulating film. A second inter-layer insulating film for covering the second wiring layer is formed on the first inter-layer insulating film. A signal wiring connected to at least one of the circuits is formed in the boundary area on the second inter-layer insulating film. A dummy wiring is formed of the same layer as the first wiring layer or the second wiring layer below the signal wiring.

Another semiconductor memory device having a memory cell area and a peripheral circuit area according to the present invention, comprises a semiconductor substrate divided into a memory cell area provided with a plurality of memory cells, a peripheral circuit area provided with a plurality of circuits for controlling the operation of the memory cells, which peripheral circuit area is provided around the memory cell area, and a boundary area provided between the memory cell area and the peripheral circuit area. A first wiring layer is formed in the memory cell area on the semiconductor substrate. A first inter-layer insulating film for covering the first wiring layer is formed on the semiconductor substrate. A second wiring layer is formed in the memory cell area on the first inter-layer insulating film. A second inter-layer insulating film for covering the second wiring layer is formed on the first inter-layer insulating film. A conductive layer is formed in the memory cell area on the second inter-layer insulating film. A third inter-layer insulating film for covering the conductive layer is formed on the second inter-layer insulating film. A signal wiring connected to at least one of the circuits is formed in a boundary area on the third inter-layer insulating film. A dummy wiring is formed of the same layer as the conductive layer below the signal wiring.

According to the present invention, there is formed the dummy wiring in the boundary area of the same layer as a wiring layer or the conductive layer in a memory cell area which is formed in a layer lower than a signal wiring layer in the boundary area. Therefore, it is possible to reduce a level difference between the memory cell area and a peripheral circuit area. Accordingly, it is possible to reduce an occurrence of disconnection and short-circuiting of the wiring and the like in the boundary area. Further, as no redundant area is formed, it is possible to achieve a higher integration of the semiconductor memory device. Furthermore, the device can be manufactured without requiring an additional manufacturing process.

DETAILED DESCRIPTION OF THE PREFERRED EMBODIMENTS

Figure 1:
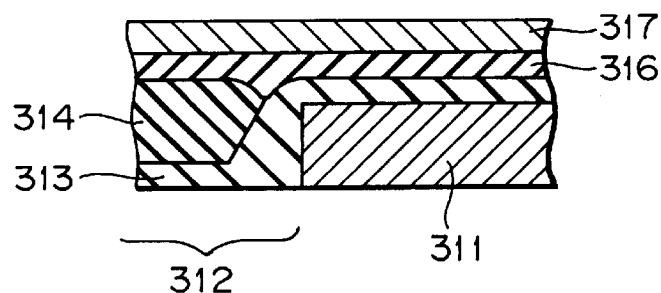
FIG. 1 is a cross-sectional view for showing a semiconductor memory device described in Japanese Patent Application Laid-open Publication No. Hei 4-82263.
Figure 2:
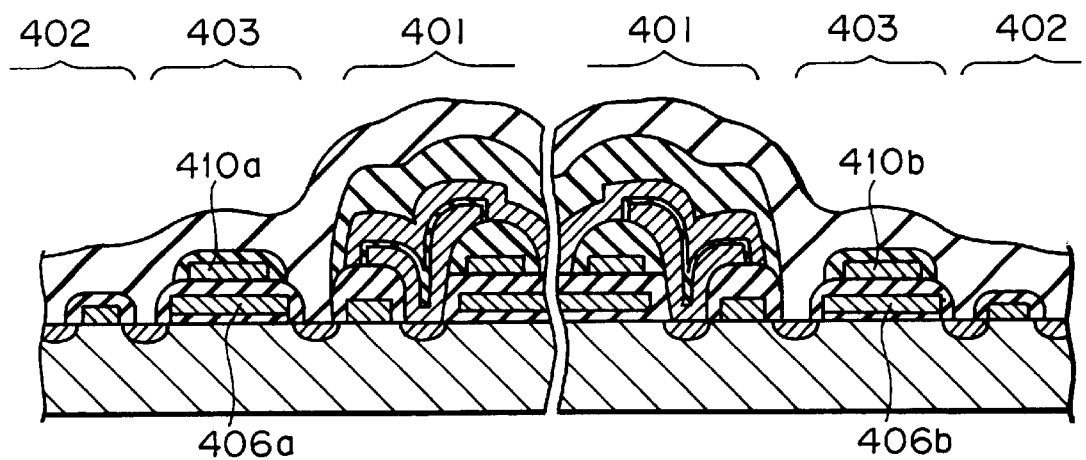
FIG. 2 is a cross-sectional view for showing a semiconductor memory device described in Japanese Patent Application Laid-open Publication No. Hei 4-87366.
Figure 3:
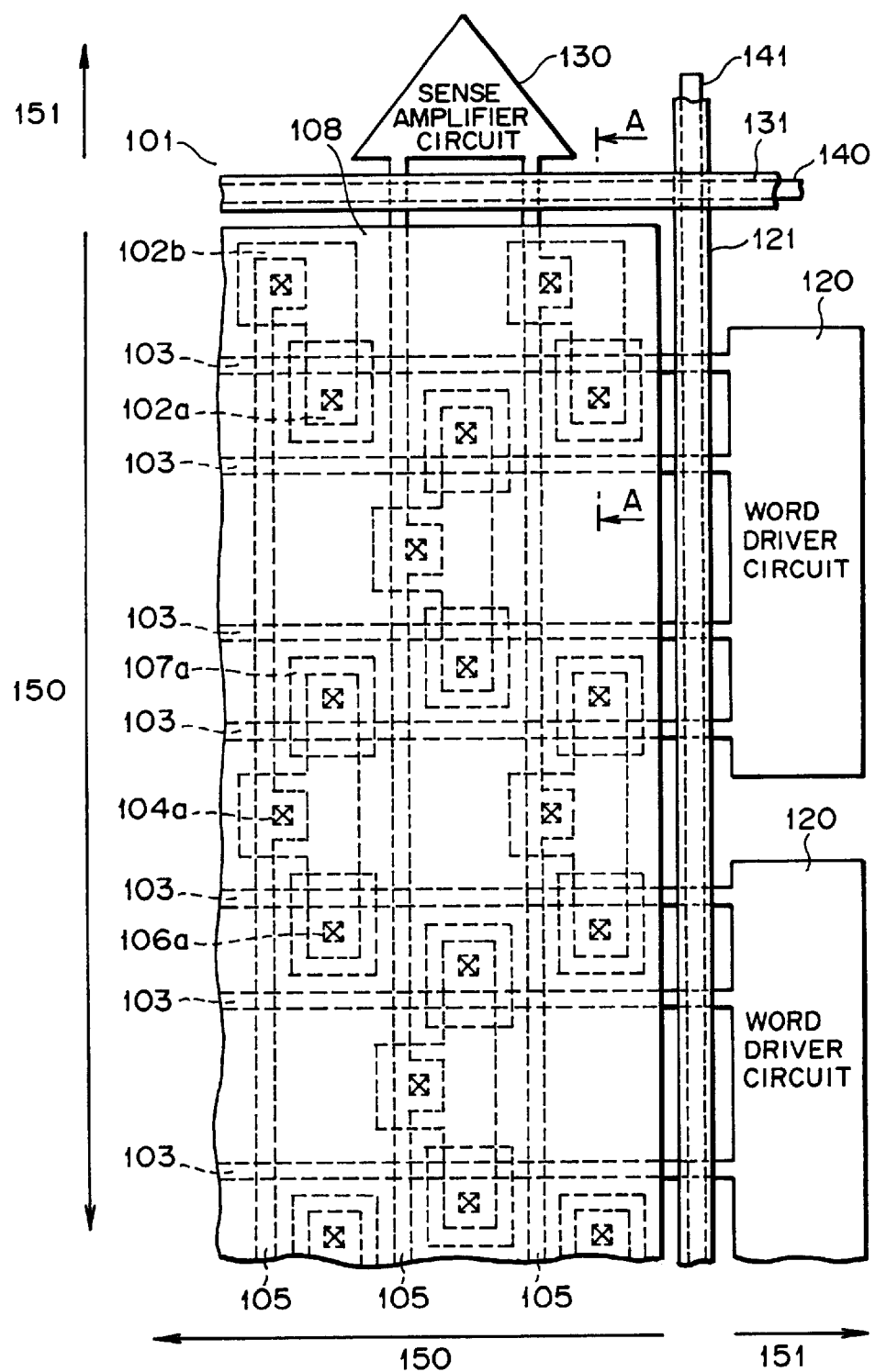
FIG. 3 is a schematic view for showing a semiconductor memory device relating to an embodiment of the present invention.
Figure 4:
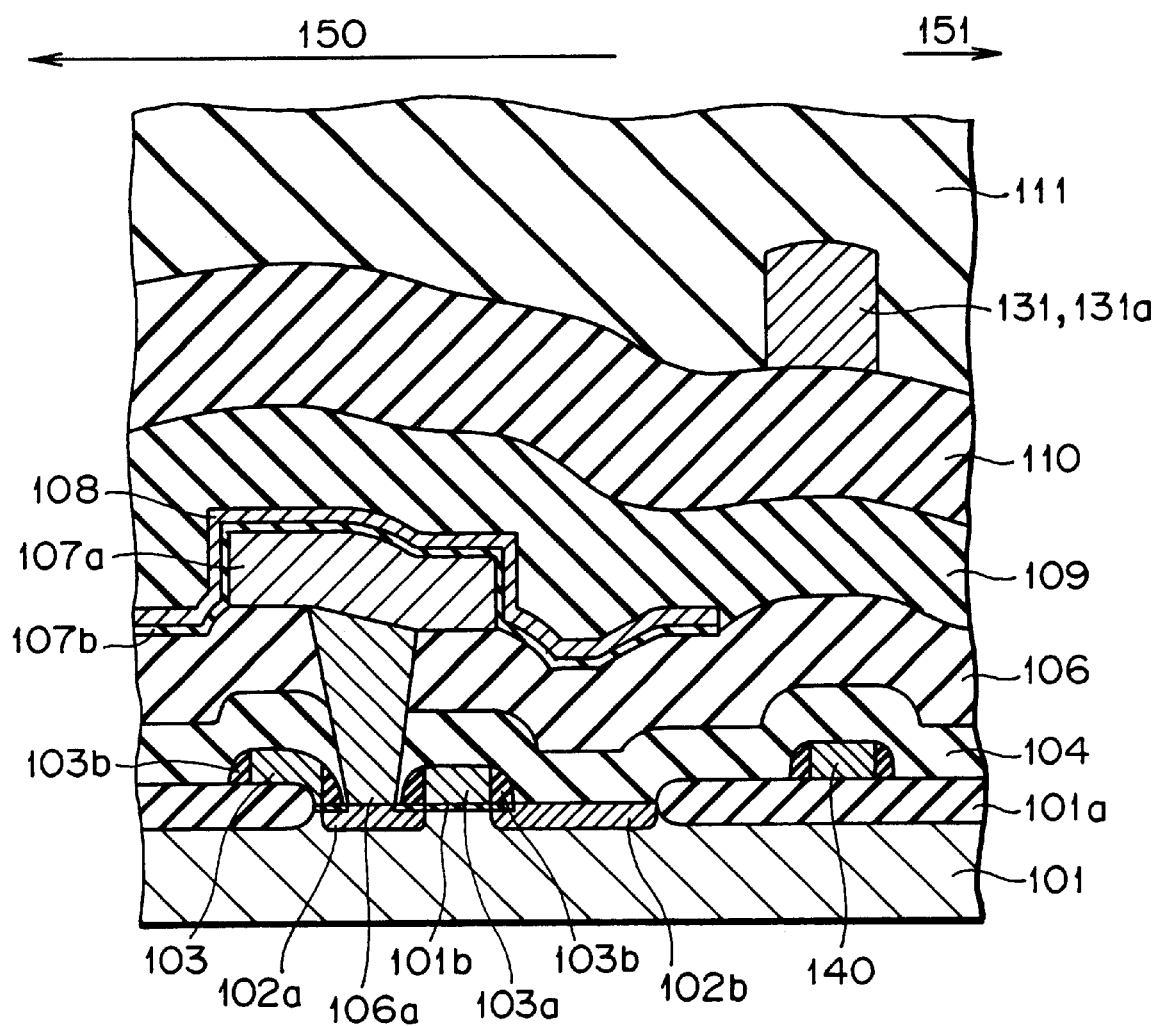
FIG. 4 is a cross-sectional view for showing a portion cut along a line A—A in FIG. 3.

There will be detailed below a semiconductor memory device having a memory cell and a peripheral circuit relating to an embodiment of the present invention with reference to the attached drawings. In the present embodiment, a plurality of stacked-type memory cells are provided. FIG. 3 is a schematic view for showing a semiconductor memory device relating to the embodiment of the present invention. FIG. 4 is a cross-sectional view for showing a portion cut along a line A—A in FIG. 3.

In the present embodiment, a semiconductor substrate 101 is divided into a memory cell area 150, a peripheral circuit area 151 and a boundary area between these areas.

The memory area 150 is provided with a plurality of DRAM memory cells having transfer transistors. A source 102a and a drain 102b of a transfer transistor are formed at the surface of the semiconductor substrate 101. In most of the memory cell area 150, the drains 102b are shared by adjacent transfer transistors.

Further, word lines 103 (a first wiring layer) are formed to pass through between the sources 102a and the drains 102b of a plurality of transfer transistors. Each of the word lines 103 also functions as a gate electrode of a transfer transistor. The word lines 103 are made of a polycrystalline silicon to have low resistance by being doped with an impurity, and are formed on the semiconductor substrate 101 through a field insulating film 101a, a gate insulating film 101b, etc.

Further, a first inter-layer insulating film 104 is formed on the word lines 103, and bit lines 105 (a second wiring layer) orthogonal with the word line 103 are formed on the first inter-layer insulating film 104. Each of the bit lines 105 have a silicide structure. Contact holes (not shown) are formed in the first inter-layer insulating film 104 positioned between the bit lines 105 and the drains 102b. Bit contacts 104a are provided within these contact holes, and the bit lines 105 are connected to the drains 102b.

A second inter-layer insulating film 106 is formed on the bit lines 105, and capacitance electrodes 107a each of that structures a capacitor for storing a charge are formed on the second inter-layer insulating film 106. Contact holes are formed continuously through the first inter-layer insulating film 104 and the second inter-layer insulating film 106 positioned between the capacitance electrodes 107a and the sources 102a. Cell contacts 106a are provided within these contact holes, and the capacitance electrodes 107a are connected to the sources 102a.

Further, separating insulating films 107b are formed on each of the capacitance electrodes 107a. A cell plate 108 for structuring the other electrode of the capacitor is formed on the separating insulating films 107b. The cell plate 108 is shared by a plurality of capacitors in the memory cell area 150.

The word lines 103 are connected to word driver circuits 120. A driving of the gate of the transfer transistor is controlled by the word driver circuits 120. A VBooT signal wiring 121 as a power source wiring for supplying power to the word driver circuits 120 is provided in the boundary area. Further, a third inter-layer insulating film 109 is formed on the second inter-layer insulating film 106, and a first aluminum wiring layer (not shown) is formed on the third inter-layer insulating film 109. The VBooT signal wiring 121 is provided in the first aluminum wiring layer.

On the other hand, the bit lines 105 are connected by each two lines to a sense amplifier circuit 130. A charge is stored in the capacitor having the capacitance electrode 107a, the separating insulating film 107b and the cell plate 108 from the bit line 105 and a charge stored in the capacitor is discharged to the bit line 105, by the sense amplifier circuit 130. Then, a signal based on a discharged electric charge is amplified by the sense amplifier circuit 130. There is also provided in a junction area a bit line pre-charge signal wiring 131 which is a signal wiring for setting the bit lines 105 to a one-half potential of a power supply voltage prior to a driving of the sense amplifier circuit 130. A fourth inter-layer insulating film 110 is formed on the first aluminum wiring layer, and a second aluminum wiring layer 131a is formed on the fourth inter-layer insulating film 110. The bit line pre-charge signal wiring 131 is provided in the second aluminum wiring layer 131a.

Further, a dummy wiring 140 is provided in the same layer (the first wiring layer) as the word lines 103 below the bit line pre-charge signal wiring 131. Similarly, a dummy wiring 141 is provided in the same layer (the second wiring layer) as the bit line 105 below the VBooT signal wiring 121.

A reduction in the difference in level according to the present embodiment will be explained in further detail.

As shown in FIG. 4, the source 102a and the drain 102b are formed at the surface of the semiconductor substrate 101 in the area partitioned by a field oxide film 101a. On the semiconductor substrate 101, there is formed a gate electrode 103a which is a part of the word line 103 via the gate insulating film 101b. A side wall 103b is formed on the side surface of the word line 103 which includes the area that becomes the gate electrode 103a.

The first inter-layer insulating film 104 for covering the word line 103 (the gate electrode 103a) and the side wall 103b is formed on the whole surface. The bit contact 104a (not shown in FIG. 4) is provided within the contact hole of the first inter-layer insulating film 104. The bit line 105 and the dummy wiring 141 (not shown in FIG. 4) stretching in the left and right directions in FIG. 4 are formed on the first inter-layer insulating film 104.

Further, on the first inter-layer insulating film 104, there is formed the second inter-layer insulating film 106 for covering the bit line 105 and the dummy wiring 141 (not shown in FIG. 4). The cell contact 106a is provided within the contact hole continuously formed on the first inter-layer insulating film 104 and the second inter-layer insulating film 106. The capacitance electrode 107a connected to this cell contact 106a is formed on the second inter-layer insulating film 106. The separating insulating film 107b and the cell plate 108 are formed in this order on the capacitance electrode 107a.

The third inter-layer insulating film 109 for covering the capacitance electrode 107a, the separating insulating film 107b and the cell plate 108 is formed on the second inter-layer insulating film 106, and the fourth inter-layer insulating film 110 is formed on the third inter-layer insulating film 109. These inter-layer insulating films 109 and 110 can be formed by, for example, a method for accumulating silicon oxide according to a CVD method or the like.

Further, the first aluminum wiring layer (not shown) is formed on the third inter-layer insulating film 109, and the second aluminum wiring layer 131a is formed on the fourth inter-layer insulating film 110. The bit line pre-charge signal wiring 131 is formed of the second aluminum wiring layer 131a. Furthermore, there is provided a fifth inter-layer insulating film 111 for covering the bit line pre-charge signal wiring 131 to electrically isolate a wiring layer formed thereon on the fourth inter-layer insulating film 110.

Then, the dummy wiring 140 is formed on the field oxide film 101a below the bit line pre-charge signal wiring 131 as described above. The dummy wiring 140 is provided on the same layer (the first wiring layer) as the word line (the gate electrode 103a).

Since the dummy wirings 140 and 141 are formed in the boundary area between the peripheral circuit area 151 and the memory cell area 150 as explained above, the difference in level between the memory cell area 150 and the peripheral circuit area 151 can be reduced further according to the present embodiment.

Further, according to the present embodiment, a signal wiring (a third wiring layer (not shown)) for selecting the sense amplifier circuit 130 is formed of the first aluminum wiring layer. This signal wiring is provided over an area between the peripheral circuit area 151 and the memory cell area 150. In this case, if there exists no dummy wiring 140, a large difference in level will exist between the peripheral circuit area 151 and the memory cell area 150. This makes it difficult to form the signal wiring in the boundary area as explained above.

On the other hand, since the dummy wiring 140 is formed in the boundary area according to the present embodiment, the difference in level between the peripheral circuit area 151 and the memory cell area 150 is reduced as shown in FIG. 4. Accordingly, it is easy to form the signal wiring that passes through the area on this level difference. Thus, an occurrence of line disconnection and the like can be restricted.

Further, as is clear from FIG. 3, it is not necessary to provide any new area for the dummy wiring 140 and the dummy wiring 141 at all. Accordingly, a new area for restricting a level difference is not necessary, and this can prevent a reduction in the level of integration.

Further, as the dummy wiring 140 is provided in the same layer as the word line 103 (the gate electrode 130a), the dummy wiring 140 can be formed in the same process as the word line 103 (the gate electrode 103a). Similarly, the dummy wiring 141 can be formed in the same process as the bit line 105. Accordingly, it is not necessary to add a new process, and this can prevent an increase in the number of processes.

While an explanation has been made in the above embodiment that the dummy wiring 140 is provided in the same layer as the word line 103 below the bit line pre-charge signal wiring 131, for example, it is also possible to arrange such that a dummy wiring is further provided in the same layer as the bit line 105 below the bit line pre-charge signal wiring 131. Similarly, there may also be provided a dummy wiring in the same layer as the word line 103 as well as the dummy wiring 141 provided in the same layer as the bit line 105, below the VBooT signal wiring 121. A dummy wiring may also be provided in the same layer as the capacitance electrode 107a.

It is also to be noted that while the above embodiment shows an example of the case where the present invention is applied to a DRAM having stacked-type memory cells, the invention is not limited to this application. For example, the invention can also be applied to a flash memory or the like having memory cells equipped with a floating gate and a control gate, to obtain a similar effect. In this case, a dummy wiring may be provided in the same layer as the floating gate and the control gate.

What is claimed is:

1. A semiconductor memory device having a memory cell area and a peripheral circuit area, comprising:
    a semiconductor substrate, said semiconductor substrate being divided into:
        a memory cell area provided with a plurality of memory cells;
        a peripheral circuit area provided with a plurality of circuits for controlling the operation of said memory cells, said peripheral circuit area being provided around said memory cell area; and
        a boundary area provided between said memory cell area and said peripheral circuit area;
    a first wiring layer disposed in said memory cell area on said semiconductor substrate;
    a first inter-layer insulating film disposed on said semiconductor substrate, for covering said first wiring layer;
    a second wiring layer formed in said memory cell area on said first inter-layer insulating film;
    a second inter-layer insulating film formed on said first inter-layer insulating film, for covering said second wiring layer;
    first a signal wiring disposed in said boundary area on said second inter-layer insulating film and connected to at least one of said circuits, said first signal layer running substantially in a first general direction;
    a second signal wiring disposed in said boundary area and connected to at least one of said circuits, said second signal layer running substantially in a second general direction;
    a first dummy wiring formed of the same layer as said first wiring layer, said first dummy wiring disposed below said first signal wiring and running substantially in the first general direction; and
    a second dummy wiring formed of the same layer as said second wiring layer, said second dummy wiring disposed below said second signal wiring and running substantially in the second general direction.

2. A semiconductor memory device according to claim 1, wherein said first wiring layer has a part that becomes a gate electrode of a MOS transistor provided in said memory cell.

3. A semiconductor memory device having a memory cell area and a peripheral circuit area, comprising:
    a semiconductor substrate, said semiconductor substrate being divided into:
        a memory cell area provided with a plurality of memory cells;
        a peripheral circuit area provided with a plurality of circuits for controlling the operation of said memory cells, said peripheral circuit area being provided around said memory cell area; and
        a boundary area provided between said memory cell area and said peripheral circuit area;
    a first wiring layer disposed in said memory cell area on said semiconductor substrate;
    a first inter-layer insulating film disposed on said semiconductor substrate, for covering said first wiring layer;
    a second wiring layer disposed in said memory cell area on said first inter-layer insulating film;
    a second inter-layer insulating film disposed on said first inter-layer insulating film, for covering said second wiring layer;
    a first signal wiring disposed in said boundary area on said second inter-layer insulating film and connected to at least one of said circuits, said first signal wiring layer running substantially in a first general direction;
    a third inter-layer insulating film disposed on said second inter-layer insulating film, for covering said first signal wiring;
    a second signal wiring disposed in said boundary area on said third inter-layer insulating film and connected to at least another one of said circuits, said second signal wiring layer running substantially in a second general direction;
    a first dummy wiring formed of the same layer as said first wiring layer, said first dummy wiring disposed below said first signal wiring and running substantially in the first general direction; and
    a second dummy wiring formed of the same layer as said second wiring layer, said second dummy wiring disposed below said second signal wiring and running substantially in the second general direction.

4. A semiconductor memory device according to claim 3, wherein said first wiring layer has a part that becomes a gate electrode of a MOS transistor provided in said memory cell.

5. A semiconductor memory device having a memory cell area and a peripheral circuit area, comprising:
- a semiconductor substrate, said semiconductor substrate being divided into:
  - a memory cell area provided with a plurality of memory cells;
  - a peripheral circuit area provided with a plurality of circuits for controlling the operation of said memory cells, said peripheral circuit area being provided around the memory cell area; and
  - a boundary area provided between said memory cell area and said peripheral circuit area;
- a first wiring layer disposed in said memory cell area on said semiconductor substrate;
- a first inter-layer insulating film disposed on said semiconductor substrate, for covering said first wiring layer;
- a second wiring layer disposed in said memory cell area on said first inter-layer insulating film;
- a second inter-layer insulating film disposed on said first inter-layer insulating film, for covering said second wiring layer;
- a first signal wiring disposed in said boundary area on said second inter-layer insulating film and connected to at least one of said circuits, said first signal wiring running substantially in a first general direction;
- a third inter-layer insulating film disposed on said second inter-layer insulating film, for covering said first signal wiring;
- a second signal wiring disposed in said boundary area on said third inter-layer insulating film and connected to at least another one of said circuits, said second signal wiring running subsatantially in a second general direction;
- a first dummy wiring formed of the same layer as said second wiring layer and disposed below said first signal wiring, said first dummy wiring running substantially in the first general direction; and
- a second dummy wiring formed of the same layer as said first wiring layer and disposed below said second signal wiring, said second dummy wiring running substantially in the second general direction.

6. A semiconductor memory device according to claim 5, wherein said first wiring layer has a part that becomes a gate electrode of a MOS transistor provided in said memory cell.

7. A semiconductor memory device having a memory cell area and a peripheral circuit area, comprising:
- a semiconductor substrate, said semiconductor substrate being divided into:
  - a memory cell area provided with a plurality of memory cells;
  - a peripheral circuit area provided with a plurality of circuits for controlling the operation of said memory cells, said peripheral circuit area being provided around said memory cell area; and
  - a boundary area provided between said memory cell area and said peripheral circuit area;
- a first wiring layer disposed in said memory cell area on said semiconductor substrate;
- a first inter-layer insulating film disposed on said semiconductor substrate, for covering said first wiring layer;
- a second wiring layer disposed in said memory cell area on said first inter-layer insulating film;
- a second inter-layer insulating film disposed on said first inter-layer insulating film, for covering said second wiring layer;
- a conductive layer disposed in said memory cell area on said second inter-layer insulating film;
- a third inter-layer insulating film disposed on said second inter-layer insulating film, for covering said conductive layer;
- a first signal wiring disposed in said boundary area on said third inter-layer insulating film and connected to at least one of said circuits, said signal wiring running substantially in a first general direction;
- a first dummy wiring formed of the same layer as said conductive layer, said first dummy wiring disposed substantially directly below said signal wiring and running substantially in the first direction;
- a second signal wiring disposed in said boundary area and running substantially in a second general direction; and
- a second dummy wiring formed of the same layer as said first wiring layer or said second wiring layer disposed below said second signal wiring and running substantially in the second general direction.

8. A semiconductor memory device having a memory cell area and a peripheral circuit area, comprising:
- a semiconductor substrate, said semiconductor substrate being divided into:
  - a memory cell area provided with a plurality of memory cells;
  - a peripheral circuit area provided with a plurality of circuits for controlling the operation of said memory cells, said peripheral circuit area being provided around said memory cell area; and
  - a boundary area provided between said memory cell area and said peripheral circuit area;
- a first wiring layer disposed in said memory cell area on said semiconductor substrate;
- a first inter-layer insulating film disposed on said semiconductor substrate, for covering said first wiring layer;
- a second wiring layer disposed in said memory cell area on said first inter-layer insulating film;
- a second inter-layer insulating film disposed on said first inter-layer insulating film, for covering said second wiring layer;
- a conductive layer disposed in said memory cell area on said second inter-layer insulating film;
- a third inter-layer insulating film disposed on said second inter-layer insulating film, for covering said conductive layer;
- a first signal wiring disposed in said boundary area on said third inter-layer insulating film and connected to at least one of said circuits, said first signal wiring running substantially in a first direction;
- a fourth inter-layer insulating film disposed on said third inter-layer insulating film, for covering said first signal wiring;
- a second signal wiring disposed in said boundary area on said fourth inter-layer insulating film and connected to at least another one of said circuits, said second signal wiring running substantially in a second direction;
- a first dummy wiring disposed of the same layer as said conductive layer and disposed below said first signal wiring; and
- a second dummy wiring formed of the same layer as said conductive layer and disposed below said second signal wiring.

9. A semiconductor memory device according to claim 8, wherein said first wiring layer has a part that becomes a gate electrode of a MOS transistor provided in said memory cell.

10. A semiconductor memory device having a memory cell area and a peripheral circuit area, comprising:
- a semiconductor substrate, said semiconductor substrate being divided into:
  - a memory cell area provided with a plurality of memory cells;
  - a peripheral circuit area provided with a plurality of circuits for controlling the operation of said memory cells, said peripheral circuit area being provided around said memory cell area; and
  - a boundary area provided between said memory cell area and said the peripheral circuit area;
- a first wiring layer disposed in said memory cell area on said semiconductor substrate;
- a first inter-layer insulating film disposed on said semiconductor substrate, for covering said first wiring layer;
- a second wiring layer disposed in said memory cell area on said first inter-layer insulating film;
- a second inter-layer insulating film disposed on said first inter-layer insulating film, for covering said second wiring layer;
- a conductive layer disposed in said memory cell area on said second inter-layer insulating film;
- a third inter-layer insulating film disposed on said second inter-layer insulating film, for covering said conductive layer;
- a first signal wiring disposed in said boundary area on said third inter-layer insulating film and connected to at least one of said circuits, said first signal wiring running substantially in a first general direction;
- a fourth inter-layer insulating film disposed on said third inter-layer insulating film, for covering said first signal wiring;
- a second signal wiring disposed in said boundary area on said fourth inter-layer insulating film and connected to at least another one of said circuits, said second signal wiring running substantially in a second general direction;
- a first dummy wiring formed of the same layer as said conductive layer below said first or second signal wiring and running substantially in either the first general direction or the second general direction;
- a second dummy wiring formed of the same layer as said first wiring layer and disposed below said first signal wiring, said second dummy wiring running substantially in the first general direction; and
- a third dummy wiring formed of the same layer as said second wiring layer and disposed below said second signal wiring, said third dummy wiring running substantially in the second general direction.

11. A semiconductor memory device according to claim 10, wherein said first wiring layer has a part that becomes a gate electrode of a MOS transistor provided in said memory cell.

12. A semiconductor memory device having a memory cell area and a peripheral circuit area, comprising:
- a semiconductor substrate, said semiconductor substrate being divided into:
  - a memory cell area provided with a plurality of memory cells;
  - a peripheral circuit area provided with a plurality of circuits for controlling the operation of said memory cells, said peripheral circuit area being provided around said memory cell area; and
  - a boundary area provided between said memory cell area and said peripheral circuit area;
- a first wiring layer disposed in said memory cell area on said semiconductor substrate;
- a first inter-layer insulating film disposed on said semiconductor substrate, for covering said first wiring layer;
- a second wiring layer disposed in said memory cell area on said first inter-layer insulating film;
- a second inter-layer insulating film disposed on said first inter-layer insulating film, for covering said second wiring layer;
- a conductive layer disposed in said memory cell area on said second inter-layer insulating film;
- a third inter-layer insulating film disposed on said second inter-layer insulating film, for covering said conductive layer;
- a first signal wiring disposed in said boundary area on said third inter-layer insulating film and connected to at least one of said circuits, said first signal wiring running substantially in a first general direction;
- a fourth inter-layer insulating film disposed on said third inter-layer insulating film, for covering said first signal wiring;
- a second signal wiring disposed in said boundary area on said fourth inter-layer insulating film and connected to at least another one of said circuits, said second signal wiring running substantially in a second general direction;
- a first dummy wiring formed of the same layer as said conductive layer below said first or second signal wiring, and running substantially in either the first general direction or the second general direction;
- a second dummy wiring formed of the same layer as said second wiring layer below said first signal wiring, said second dummy wiring running substantially in the first general direction; and
- a third dummy wiring disposed of the same layer as said first wiring layer below said second signal wiring, said third dummy wiring running substantially in the second general direction.

13. A semiconductor memory device according to claim 12, wherein said first wiring layer has a part that becomes a gate electrode of a MOS transistor provided in said memory cell.

* * * * *